United States Patent
Manku

(10) Patent No.: US 7,343,135 B2
(45) Date of Patent: Mar. 11, 2008

(54) METHOD AND APPARATUS FOR DOWN CONVERSION OF RADIO FREQUENCY (RF) SIGNALS

(75) Inventor: Tajinder Manku, Waterloo (CA)

(73) Assignee: Sirific Wireless Corporation, Waterloo, Ontario (CA)

( * ) Notice: Subject to any disclaimer, the term of this patent is extended or adjusted under 35 U.S.C. 154(b) by 500 days.

(21) Appl. No.: 10/505,413

(22) PCT Filed: Feb. 25, 2003

(86) PCT No.: PCT/CA03/00256

§ 371 (c)(1),
(2), (4) Date: Mar. 28, 2005

(87) PCT Pub. No.: WO03/071696

PCT Pub. Date: Aug. 28, 2003

(65) Prior Publication Data

US 2005/0180528 A1 Aug. 18, 2005

Related U.S. Application Data

(60) Provisional application No. 60/360,069, filed on Feb. 25, 2002.

(51) Int. Cl.
*H04B 7/14* (2006.01)
*H04B 7/32* (2006.01)
*H04B 1/18* (2006.01)
*H03J 7/32* (2006.01)

(52) U.S. Cl. .......... 455/20; 455/147; 455/148; 455/150.1; 455/151.1; 455/151.3; 375/216

(58) Field of Classification Search ............ 455/20, 455/147, 148, 150.1, 151.1, 151.3; 375/216
See application file for complete search history.

(56) References Cited

U.S. PATENT DOCUMENTS

| | | | |
|---|---|---|---|
| 2005/0003787 A1* | 1/2005 | Chen ................... | 455/264 |
| 2006/0141952 A1* | 6/2006 | Kung et al. ............. | 455/102 |
| 2006/0246861 A1* | 11/2006 | Dosanjh et al. ........ | 455/147 |
| 2007/0077902 A1* | 4/2007 | Imae et al. ............ | 455/151.3 |

FOREIGN PATENT DOCUMENTS

WO    01 17122    3/2001

\* cited by examiner

*Primary Examiner*—Lana Le
*Assistant Examiner*—Bobbak Safaipour
(74) *Attorney, Agent, or Firm*—Shin Hung; Borden Ladner Gervais LLP

(57) ABSTRACT

There is a need for an inexpensive, high-performance, fully-integrable, multi-standard transceiver, which suppresses spurious noise signals. The invention provides a topology that satisfies this need, using a first signal generator which produces an oscillator signal f1 and a second signal generator which produces a mono-tonal mixing signal $\phi 2$, where f1 is a multiple of the frequency of $\phi 2$; and a logic circuit for generating a multi-tonal mixing signal $\phi 1$, where $\phi 1 * \phi 2$ has significant power at the frequency of said local oscillator signal being emulated, neither of said cp1 nor said $\phi 2$ having significant power at the carrier frequency of said input signal x(t) or said LO signal being emulated.

29 Claims, 11 Drawing Sheets

METHOD AND APPARATUS FOR DOWN CONVERSION OF RADIO FREQUENCY (RF) SIGNALS

The present invention relates generally to communications, and more specifically to a method and apparatus of demodulating RF (radio frequency) signals. The preferred embodiment of the invention satisfies the need for an inexpensive, high-performance, fully-integrable, multi-standard receiver.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal may be, for example: data, voice or video. These baseband signals may be produced by transducers such as microphones or video cameras, be computer generated, or transferred from an electronic storage device. In general, the high frequencies provide longer range and higher capacity channels than baseband signals, and because high frequency signals can effectively propagate through the air, they can be used for wireless transmissions as well as hard wired or wove guided channels.

All of these signals are generally referred to as RF signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point-to-point communications, and wide area networks (WANs) such as the Internet. These networks generally communicate data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

Most RF receivers use the "super-heterodyne" topology, which provides good performance in a limited scope of applications, such as in public-broadcast FM radio receivers. As will be explained, these limitations make its use in more sophisticated modern applications expensive, and its performance poor.

The super-heterodyne receiver uses a two-step frequency translation method to convert an RF signal to a baseband signal. FIG. 1 presents a block diagram of a typical super-heterodyne receiver 10. The mixers labelled M1 12 and M2 14 are used to translate the RF signal to baseband or to some intermediate frequency (IF). The balance of the components amplify the signal being processed and filter noise from it.

The RF band pass filter (BPF1) 18 first filters the signal coming from the antenna 20 (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter (BPF2) 24 usually identified as an image rejection filter. The signal then enters mixer M1 12 which multiplies the signal from the image rejection filter 24 with a periodic signal generated by the local oscillator (LO1) 26. The mixer M1 12 receives the signal from the image rejection filter 24 and translates it to a lower frequency, known as the first intermediate frequency (IF1).

Generally, a mixer is a circuit or device that accepts as its input two different frequencies and presents at its output:
(a) a signal equal in frequency to the sum of the frequencies of the input signals;
(b) a signal equal in frequency to the difference between the frequencies of the input signals; and
(c) the original input frequencies.

The typical embodiment of a mixer is a digital switch which may generate significantly more tones than stated above.

The IF1 signal is next filtered by a band pass filter (BPF3) 28 typically called the channel filter, which is centred around the IF1 frequency, thus filtering out the unwanted products of the first mixing processes; signals (a) and (c) above. This is necessary to prevent these signals from interfering with the desired signal when the second mixing process is performed.

The signal is then amplified by an intermediate frequency amplifier (IFA) 30, and is mixed with a second local oscillator signal using mixer M2 14 and local oscillator (LO2) 32. The second local oscillator LO2 32 generates a periodic signal which is typically tuned to the IF1 frequency. Thus, the signal coming from the output of M2 14 is now at baseband, that is, the frequency at which the signal was originally generated. Noise is now filtered from the desired signal using the low pass filter LPF 38, and the signal is passed on to some manner of presentation, processing or recording device. For example, in the case of a radio receiver, this might be an audio amplifier, while in the case of a computer modem this may be an analogue to digital convertor.

Note that the same process can be used to modulate or demodulate any electrical signal from one frequency to another.

The main problems with the super-heterodyne design are:
  it requires expensive off-chip components, particularly band pass filters 18, 24, 28, and low pass filter 38;
  the off-chip components require design trade-offs that increase power consumption and reduce system gain;
  image rejection is limited by the off-chip components, not by the target integration technology;
  isolation from digital noise can be a problem; and
  it is not fully integratable.

The band pass and low pass filters 18, 24, 28 and 38 used in super-heterodyne systems must be high quality devices, so electronically tunable filters cannot be used. As well, the only way to use the super-heterodyne system in a multi-standard/multi-frequency application is to use a separate set of off-chip filters for each frequency band.

Direct-conversion transceivers attempt to perform up and down conversion in a single step, using one mixer and one local oscillator. In the case of down-conversion to baseband, this requires a local oscillator (LO) with a frequency equal to that of the input RF signal. If the LO signal of a direct conversion receiver leaks into the signal path, it will also be demodulated to baseband along with the input signal, causing interference. This LO leakage problem limits the utility of direct-conversion transceivers.

One of the current problems in the art is to develop effective receivers that can adapt to the varying requirements caused either by changing reception conditions, or even changing standards during the use of the device. For cellular telephones and similar consumer items, it is desirable to have receivers that can be fully integrated onto inexpensive, low power integrated circuits (ICs).

This continuing desire to implement low-cost, power efficient receivers has led to intensive research into the use of highly integrated designs, an increasingly important aspect for portable systems, including cellular telephone handsets. This has proven especially challenging as the frequencies of interest in the wireless telecommunications industry (especially low-power cellular/micro-cellular voice/data personal communications systems) have risen above those used previously (approximately 900 MHz) into the spectrum above 1 GHz.

Attempts to provide flexible designs in Radio Frequency Integrated Circuits (RFICs)—also known as monolithic microwave integrated circuits (MMICs)—allowing for multiple standards and varying conditions of reception have met with limited success. These designs usually provide this functionality by means of multiple, independent signal paths—one signal path and set of components for each frequency standard and/or set of operating conditions. This is an expensive and physically bulky approach which suffers from all of the performance problems described above.

Thus, there is a need for a method and apparatus for modulation and demodulation which addresses the problems above. It is desirable that this design be fully-integratable, inexpensive and high performance. As well, it is desirable that this design be easily applied to multi-standard/multi-frequency applications.

SUMMARY OF THE INVENTION

It is therefore an object of the invention to provide a novel method and system of modulation and demodulation which obviates or mitigates at least one of the disadvantages of the prior art.

One aspect of the invention is defined as a demodulator circuit for emulating the down conversion of an input signal x(t) with a local oscillator (LO) signal, the demodulator circuit comprising: a first mixer for receiving the input signal x(t), and mixing the input signal x(t) with a multi-tonal mixing signal ϕ1, to generate an output signal ϕ1 x(t); a second mixer for receiving the signal ϕ1 x(t) as an input, and mixing the signal ϕ1 x(t) with a mono-tonal mixing signal ϕ2, to generate an output signal ϕ1 ϕ2 x(t); a first signal generator for generating an oscillator signal f1; a second signal generator for generating the mono-tonal mixing signal ϕ2, where the frequency of f1 is a multiple of the frequency of ϕ2; and a logic circuit for receiving the oscillator signal f1 and the mono-tonal mixing signal ϕ2, and generating the multi-tonal mixing signal ϕ1, where ϕ1*ϕ2 has significant power at the frequency of the local oscillator signal being emulated, neither of the ϕ1 nor the ϕ2 having significant power at the carrier frequency of the input signal x(t) or the LO signal being emulated.

Another aspect of the invention is defined as a method of emulating the demodulation of an input signal x(t) to the product of the input signal with a local oscillator (LO) signal, the method comprising the steps of: generating an oscillator signal f1; generating a mixing signal ϕ2, where the frequency of f1 is a multiple of the frequency of ϕ2; generating an aperiodic mixing signal ϕ1, using a logic circuit which receives the oscillator signal f1 and the second mixing signal ϕ2, as inputs, where ϕ1*ϕ2 has significant power at the frequency of a local oscillator signal being emulated, and neither of the ϕ1 nor the ϕ2 having significant power at the frequency of the input signal x(t), the LO signal being emulated, or the output signal ϕ1 ϕ2 x(t); mixing the input signal x(t) with the aperiodic mixing signal ϕ1, to generate an output signal ϕ1 x(t); and mixing the signal ϕ1 x(t) with a second mixing signal ϕ2, to generate an output signal ϕ1 ϕ2 x(t).

BRIEF DESCRIPTION OF THE DRAWINGS

These and other features of the invention will become more apparent from the following description in which reference is made to the appended drawings in which.

DETAILED DESCRIPTION OF THE INVENTION

Figure 1:
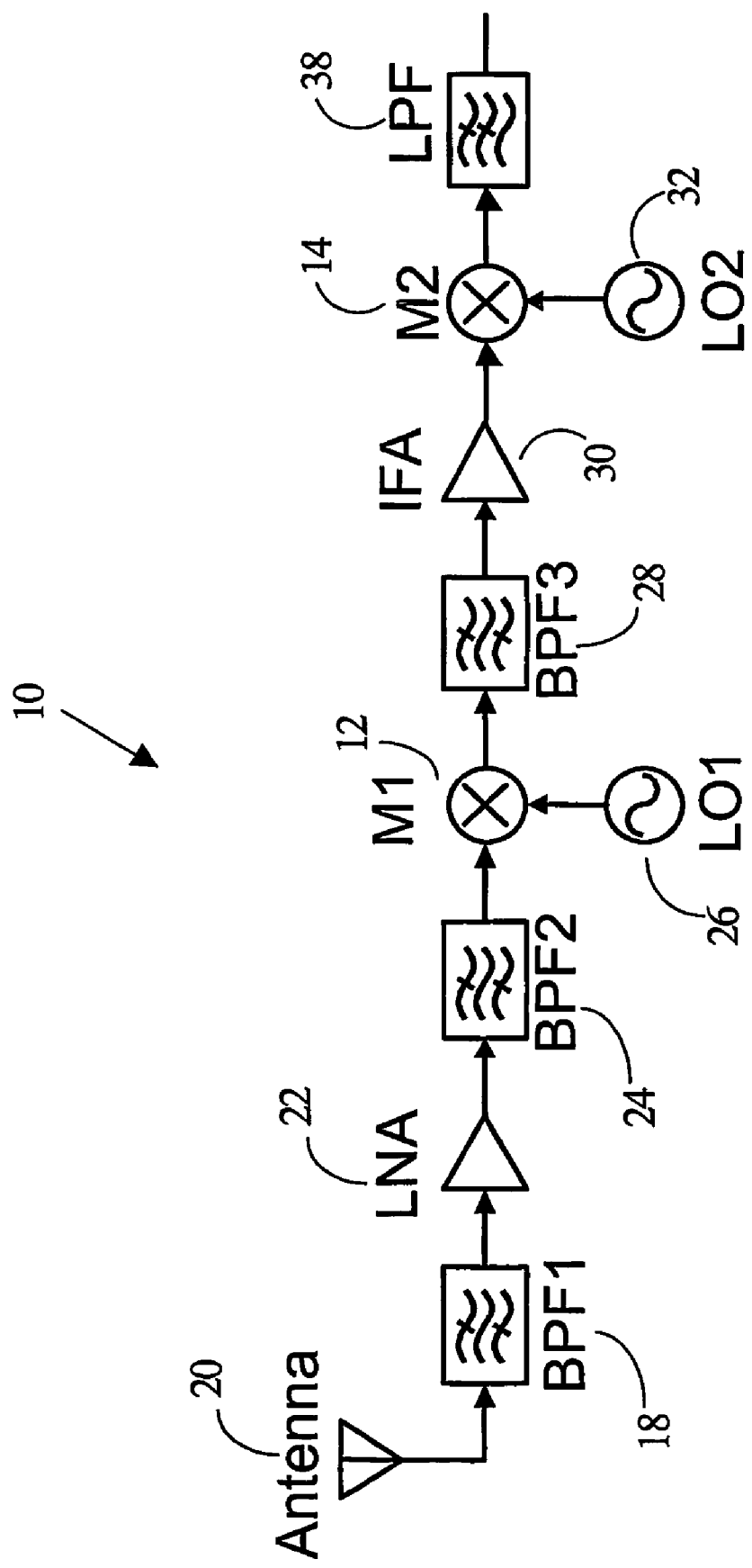
FIG. 1 presents a block diagram of a super-heterodyne system as known in the art.
Figure 2:
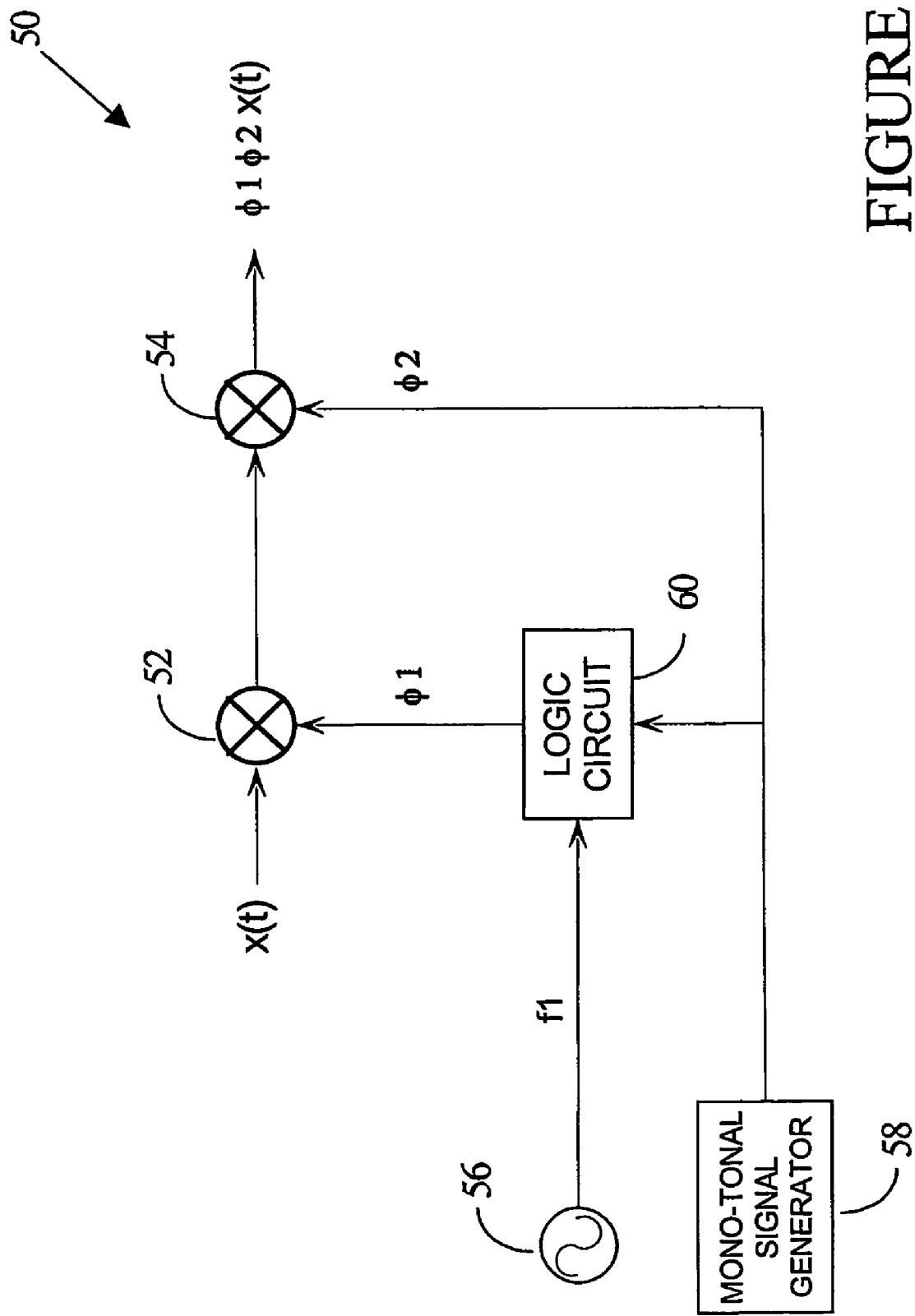
FIG. 2 presents a block diagram of a demodulator topology in a broad embodiment of the invention.

A circuit which addresses a number of the objects outlined above is presented as a block diagram in FIG. 2. This figure presents a demodulator topology 50 in which an input signal x(t) is down-converted by mixing it with two mixing signals ϕ1 and ϕ2. As will be described, these two mixing signals are ϕ1 and ϕ2 are very different from mixing signals used in normal two-step conversion topologies (such as superheterodyne topologies). The main difference from the direct-conversion approach is that two mixing signals of the invention are used emulate the single mixing signal, and they do this without the usual short comings of direct-conversion, such as self-mixing.

As shown in FIG. 2, the input signal x(t) is mixed with a multi-tonal mixing signal ϕ1 using a first mixer 52 (multi-tonal, or non-mono-tonal, refers to a signal having more than one fundamental frequency tone. Mono-tonal signals have one fundamental frequency tone and may have other tones that are harmonically related to the fundamental tone). The resulting signal, ϕ1 x(t), is then mixed with a mono-tonal signal $\phi_2$ by means of a second mixer 54, generating an output signal ϕ1 ϕ2 x(t). These mixing signals ϕ1 and ϕ2 are generally referred to herein as "virtual local oscillator" (VLO) signals as they emulate a local oscillator signal, as the product ϕ1*ϕ2 has significant power at the frequency of a local oscillator signal being emulated. However, neither ϕ1 nor φ2 have significant power at the frequency of the input signal x(t), the LO signal being emulated, or the output signal φ1 φ2 x(t). Mixing signals with such characteristics greatly resolve the problem of self-mixing because the VLO signals simply do not have significant power at frequencies that will interfere with the output signal.

Figure 3:
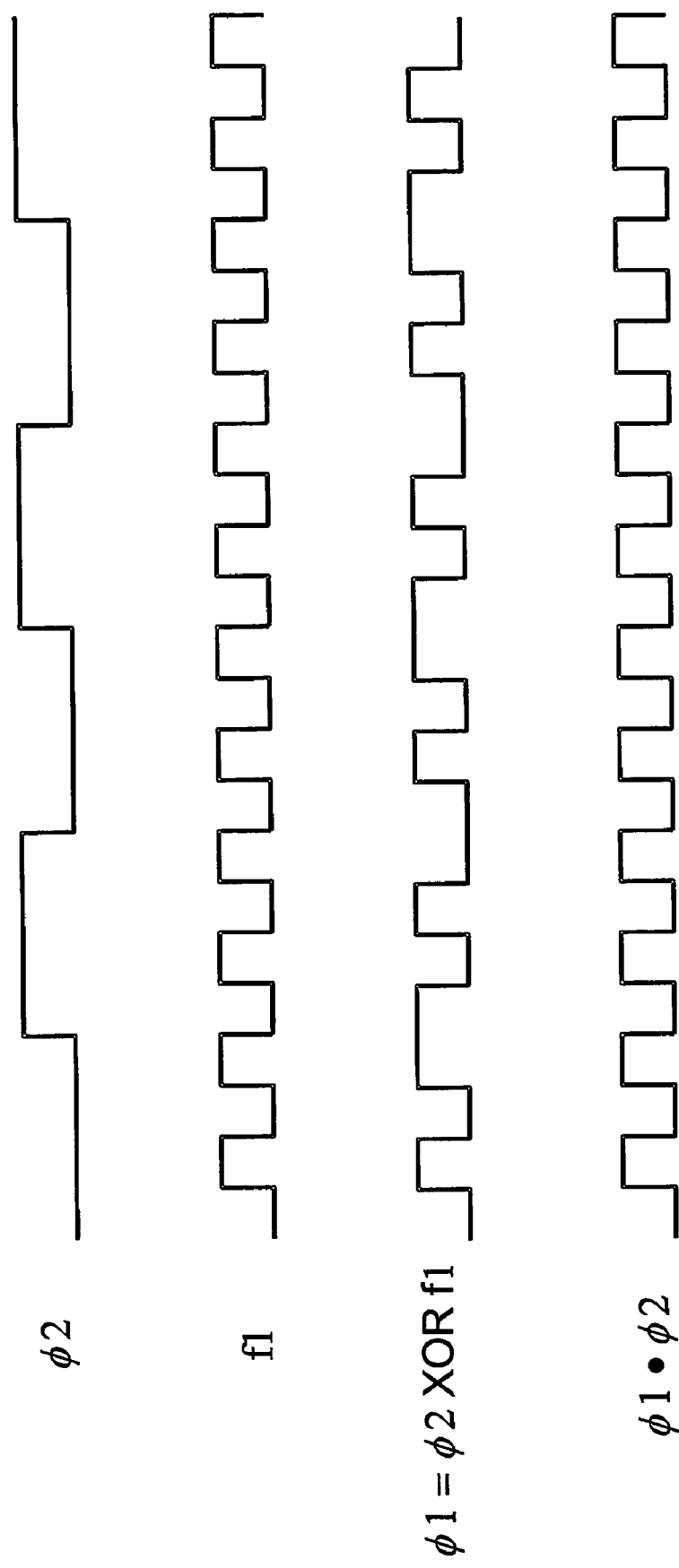
FIG. 3 presents a timing diagram of a set of mixing signals in a broad embodiment of the invention.

These VLO signals are described in greater detail hereinafter, but an exemplary pair of φ1 and φ2 mixing signals is presented in FIG. 3, plotted in amplitude versus time. An oscillator signal f1 is used to generate φ1, and in this case, f1 operates at a frequency that is four times that of φ2. Clearly, φ1 can be generated from the simple logical operation of φ2 XOR f1. As well, the product of these two mixing signals, φ1*φ2, is clearly equal to the desired LO signal. Thus, the output φ1 φ2 x(t) will be equal to the output of a hypothetical LO*x(t) down conversion.

However, it is important to note that at no point in the operation of the circuit is an actual "φ1*φ2" signal ever generated and if it is, only an insignificant amount is generated. The mixers 52, 54 receive separate φ1 and φ2 signals, and mix them with the input signal x(t) using different physical components. Hence, there is no LO signal which may leak into the circuit.

Looking at one cycle of these mixing signals from FIG. 3 the generation of the φ1*φ2 signal is clear:

| φ2 | f1 | φ1 = φ2 XOR f1 | φ1 * φ2 |
|----|----|----|----|
| LO | LO | LO | LO |
| LO | HI | HI | HI |
| LO | LO | LO | LO |
| LO | HI | HI | HI |
| HI | LO | HI | LO |
| HI | HI | LO | HI |
| HI | LO | HI | LO |
| HI | HI | LO | HI |

Clearly, the two mixing signals φ1 and φ2 in FIG. 3 satisfy the criteria for effective VLO signals.

The only problem with this embodiment is that f1 does have power at the frequency of the LO signal being emulated, thus care must be taken to isolate it and to minimize any self-mixing that it might cause. This could be done using standard analogue design and layout techniques, as known in the art. These techniques could include, for example:

1. placing the oscillator on-chip. If the oscillator was off-chip, integrated circuit pins and tracks of the printed circuit board might serve as antennas which radiate the oscillator signal; or
2. using an oscillator which operates at a higher frequency than f1, and down converting it using a divider. In the embodiments described hereinafter, a regenerative divider is used, which is particularly effective.

Also shown in FIG. 2, is a highly effective manner for generating the two mixing signals φ1 and φ2. Two signal generators are employed: a first signal generator 56 for generating the oscillator signal f1, and a second signal generator 58 for generating the mono-tonal mixing signal φ2. To generate the multi-tonal φ1 mixing signal, the two signals f1 and φ2 are then fed into a logic circuit 60 which generates the multi-tonal mixing signal φ1 that satisfies the VLO criteria.

This logic circuit 60 could be implemented in many different forms, varying with the precise patterns of signals φ1 and φ2 that are desired. To generate the pairing of φ1 and φ2 shown in the table above and in FIG. 3, for example, a simple logic exclusive-OR (XOR) gate could be employed. Other logic circuits and design principles are described in detail hereinafter.

While this circuit contains many components that are similar to commonly used demodulation topologies, it uses them in a unique way. Thus, this circuit:

1. allows an input signal x(t) to be down-converted using a completely integratable circuit;
2. does not use mixing signals that contain significant power at the frequency of the local oscillator signal being emulated. Thus, the frequency translation is still effected, but self-mixing and unwanted mixing products are avoided; and
3. is particularly convenient when applied to the development of multi-standard/multi-frequency devices because no filters are required, and because the mixing signals can be generated and varied so easily. This advantage will become more clear from the description which follows.

Other advantages of the invention will also become clear from the other embodiments of the invention described hereinafter.

Note that particular design parameters for the two mixers 52 and 56 would be clear to one skilled in the art, having the typical properties of an associated noise figure, linearity response, and conversion gain. The selection and design of these mixers would follow the standards known in the art.

Though FIG. 2 implies that various elements are implemented in analogue form, they can also be implemented in digital form. The mixing signals are typically presented herein in terms of binary 1s and 0s, however, bipolar waveforms, ±1, may also be used. Bipolar waveforms are typically used in spread spectrum applications because they use commutating mixers which periodically invert their inputs in step with a local control signal (this inverting process is distinct from mixing a signal with a local oscillator directly).

A number of other embodiments of the invention will now be described.

DESCRIPTION OF PREFERRED EMBODIMENTS OF THE INVENTION

Figure 4:
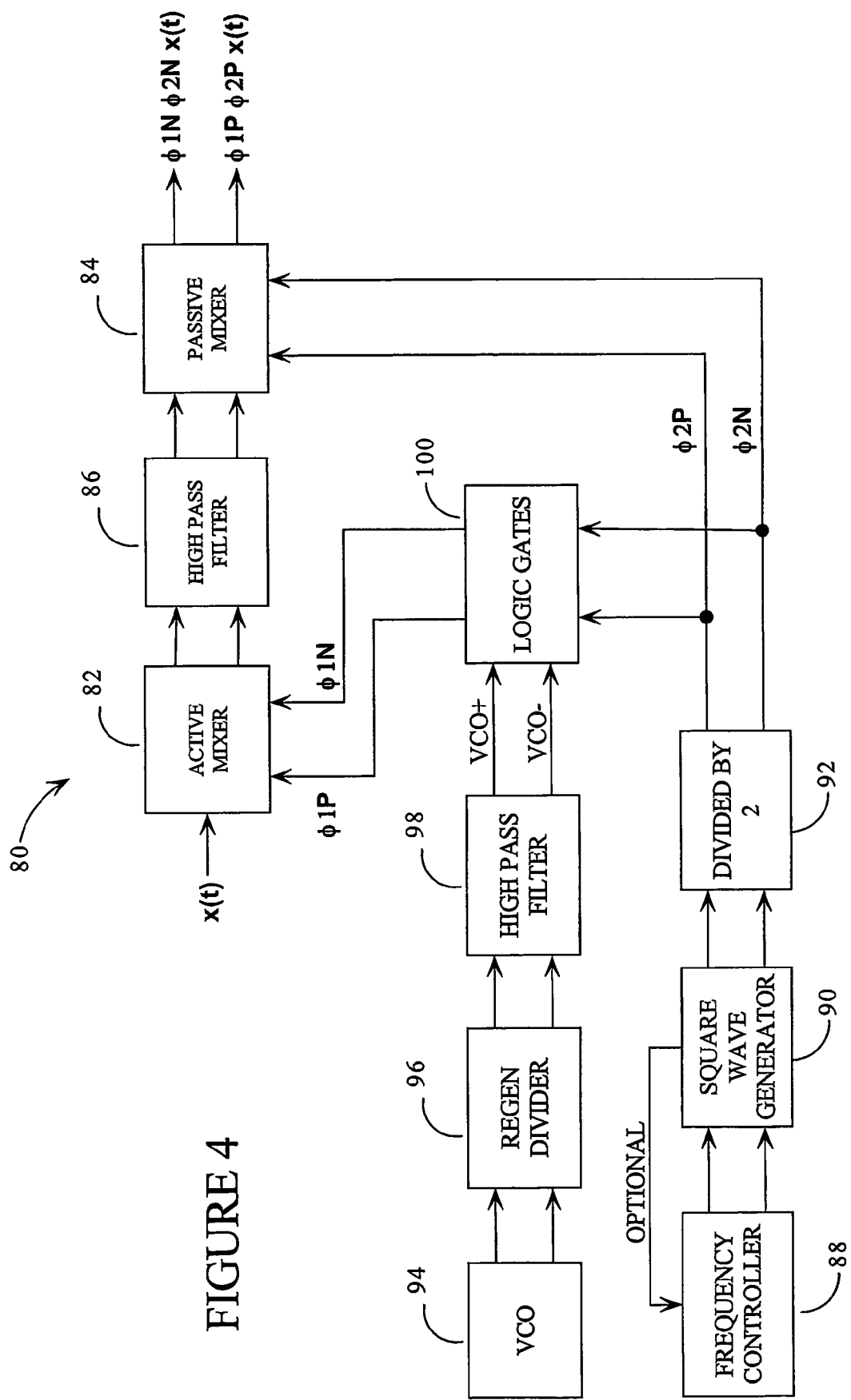
FIG. 4 presents a block diagram of a differential demodulator topology in an embodiment of the invention.

The preferred embodiment of the invention is presented as a block diagram in FIG. 4. At the core, this topology consists of two differential mixers 82, 84 connected together via a high pass filter (HPF) 86. At the LO ports of the two mixers 82, 84 differential mixing signals φ1P, φ1N, φ2P and φ2N are applied such that the incoming RF signal, x(t), is multiplied by a signal having significant power at the RF carrier frequency of x(t), downconverting it to baseband.

Differential signals are signals having positive and negative potentials with respect to ground, rather than a single potential with respect to ground. The use of a differential architecture results in a stronger output signal that is more immune to common mode noise than the architecture presented in FIGS. 2 and 3. If, for example, environment noise imposes a noise signal onto the input RFin of FIG. 3, then this noise signal will propagate through the circuit. However, if this environment noise is imposed equally on the φ1P and φ1N inputs in the differential circuit, then the net effect will be null.

Figure 5:
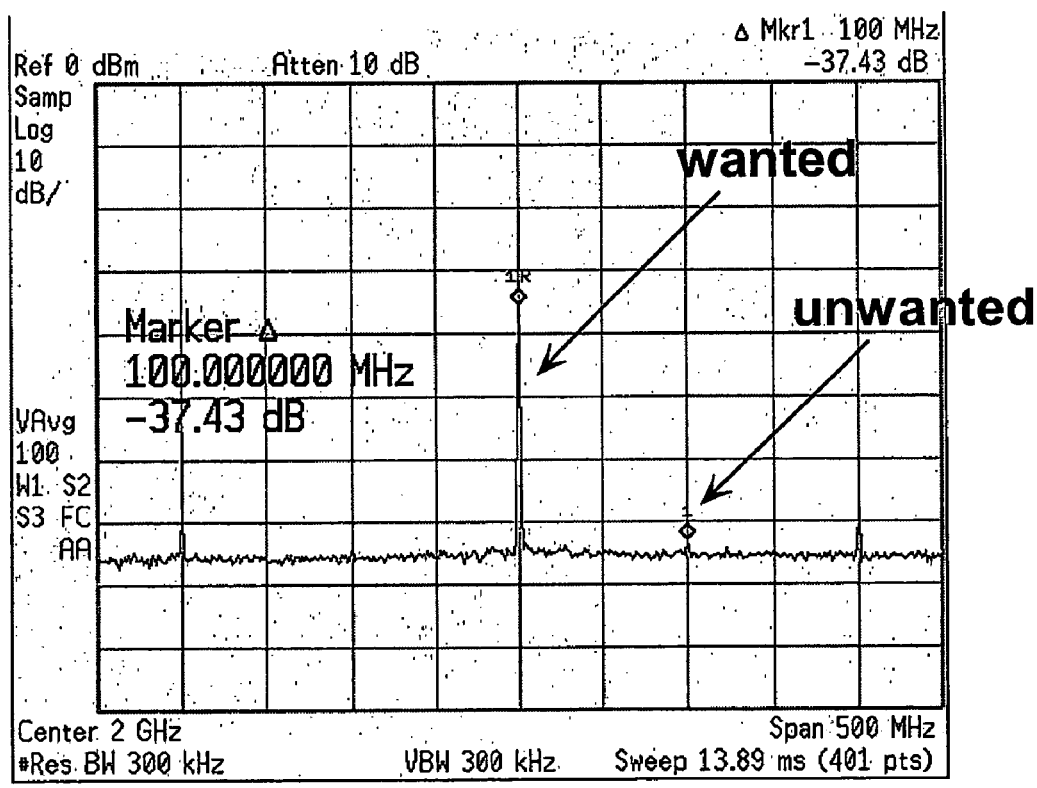
FIG. 5 presents a frequency spectrum analysis demonstrating a possible noise problem.
Figure 6:
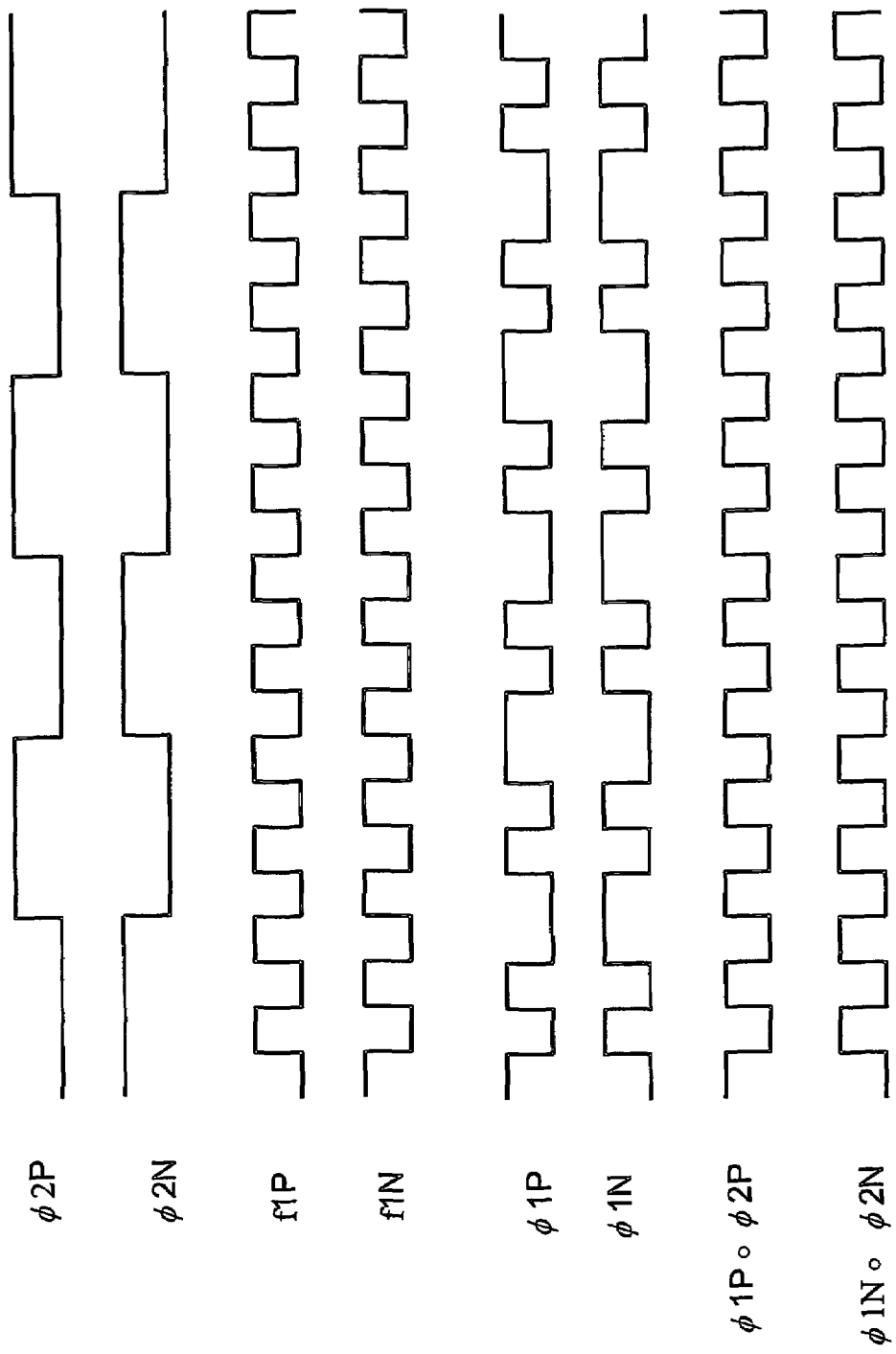
FIG. 6 presents a timing diagram of a set differential mixing signals plotted in amplitude against time, in an embodiment of the invention.

While this circuit is very effective, there will be power generated at baseband arising from unwanted RF signals and spurious tones generated by φ1*φ2. The frequency spectrum of φ1*φ2 can be seen in the frequency spectrum test data of FIG. 5. The amount of unwanted power can be controlled via the time delay and frequency of signal φ2. The unwanted power will down convert signals located at the "unwanted power frequencies". For example, if there is unwanted power at 2100 MHz and there is an out of band RF signal at 2100 MHz, this RF signal will be down converted on top of the wanted signal. However, this down converted power will be attenuated by the difference between "the power of the wanted" minus "the power of the unwanted" (for FIG. 5 this is ~37 dB). We refer to this difference herein as WmU (Wanted minus Unwanted).

If RFwanted denotes the wanted RF power, the total amount of power at baseband is approximately:

$$BBpower = RFwanted + 10^{\wedge}(-WmU/10) * RFunwanted \qquad (1)$$

There are three ways to reduce this unwanted signal:
1. increasing the value of WmU;
2. adjusting the frequency of φ2 such that the RFunwanted tone does not fall on top of the wanted signal at baseband; and/or
3. frequency hopping φ2 so that probability of RFunwanted tone falling on top of the wanted signal significantly is reduced.

The embodiments of the invention described with respect to FIGS. 4 through 11 present a number of ways of performing this functionality.

As noted above, the core of the topology in FIG. 4 consists of a first mixer 82 for receiving an input signal x(t), followed by a HPF 86, and a second mixer 84 which generates a differential output φ1 φ2 x(t). The first mixer 82 is preferably an active mixer, and the second mixer 84, a passive mixer. Active mixers are distinct from passive mixers in a number of ways:
1. they provide conversion gain; thus, an active mixer can replace the combination of a low noise amplifier and a passive mixer;
2. active mixers provide better isolation between the input and output ports because of the impedance of the active components; and
3. active mixers allow a lower powered mixing signal to be used, reducing the noise that results when the mixing signal is generated.

In spite of these advantages, the application of active mixers in modulation and demodulation topologies is still problematic. Because active mixers are non-linear devices, they generate more "1/f" noise and produce second-order distortion. This noise is called 1/f noise because its power spectra is generally inversely proportional to the frequency—in other words, the power of the noise signal is greater, close to DC (direct current).

In the topology of the invention, this second-order distortion is removed using the high pass filter (HPF) 86. Because the second mixer 84 is a passive mixer and it operates at a relatively lower frequency, it does not introduce a significant amount of second-order distortion into the signal. Thus, this topology provides the benefits of active mixing, without introducing second-order distortion into the output signal.

As noted above, the input signal x(t) is down converted to baseband using the two mixers 82, 84 and differential mixing signals φ1P, φ1N, φ2P and φ2N. Because differential mixing signals are employed, positive and negative pairings must be generated for each of φ1 and φ2. Each pairing of positive and negative signal components are simply complements of one another, so the pattern of these signals follows logically from the amplitude vs. time graph of FIG. 3. For completeness however, the development of these signals are shown in the amplitude vs. time graph of FIG. 6. In short:
1. each "P" signal is a complement of its corresponding "N" signal;
2. φ1P=φ2P XOR f1P;
3. φ1N=φ2N XOR f1N; and
4. of course, when complementary mixing signals are mixed together, they emulate a LO signal:
   a. φ1P*φ2P=LO; and
   b. φ1N*φ2N=LO.

As shown in FIG. 4, φ2P and φ2N are preferably generated using a frequency controller 88, a square wave generator 90 and a divide-by-2 92.

The square wave generator 90 and divide-by-2 92 are simple components as known in the art. The square wave generator 90 merely receives control signals from the frequency controller 88, and generates differential mono-tonal signals at the frequency indicated by the frequency controller 88. The divide-by-2 92 simply divides the square waves it receives from the square wave generator 90. The divide-by-2 element is used to ensure that the output signals φ2P and φ2N have a ~50% duty cycle, to increase the second order input intercept point (IIP2) of the second mixer 84.

The frequency controller 88, however, may take many forms. In a simple implementation, it may be a static component, or used to manually select between a number of frequencies of operation for the device in which the invention is employed. It may also operate in an automated manner, recognizing which frequency bands the device should be operating in at a given point in time. This would be a typical implementation for a multi-standard device. Other functionality which could easily be built into the frequency controller 88 includes the following:
1. the functionality to hop the mixing signals φ2P and φ2N from one frequency to another. This reduces the probability of φ2P*φ2N having power at an unwanted frequency. Typically, the rate of hopping should be at least greater than the data/symbol rate of the data;
2. the functionality to obtain feedback from the receiver, allowing the frequency controller 88 to adjust the frequency of the mixing signals φ2P and φ2N to avoid certain interference or noise that has been detected;
3. the functionality to receive a manual input from the user, to adjust the frequency of the mixing signals φ2P and φ2N to avoid certain interference or noise; and
4. the functionality to receive an output from the square wave generator 90, so that the frequency controller 88 operates in a phase-locked loop manner, improving stability.

Mixing signals φ1P and φ1N are preferably generated using the φ2P and φ2N signals as well as the voltage controlled oscillator 94, regenerative divider 96, high pass filter 98 and logic gates 100 shown in FIG. 4.

The voltage controlled oscillator (VCO) 94, is a standard VCO as known in the art, generating differential mono-tonal signals in the range dictated by the operating range of the receiver 80. As noted above, it is desirable that these mono-tonal VCO signals avoid the frequency of the LO being emulated and the carrier frequency of the input signal x(t), to minimize self-mixing. The output signal from the VCO 94 will be divided down by the regenerative divider 96.

This VCO 94 may be implemented as an off-chip component, or may be on-chip. The frequency output by the VCO 94 may be held constant, or may vary in a coordinated way with the frequency controller 88, to reduce noise or effect multi-standard operation, or to switch to a different frequency band or channel.

As noted, the output of the VCO 94 is fed to the regenerative divider 96, which divides the frequency down (of course, a frequency multiplier could also be used, in which case the output of the VCO 94 would be converted up in frequency. Alternatively, a standard divide/multiply-by-N element could also be used). Regenerative dividers are known in the art of electronic circuit design, but are not widely applied in telecommunications.

Figure 7:
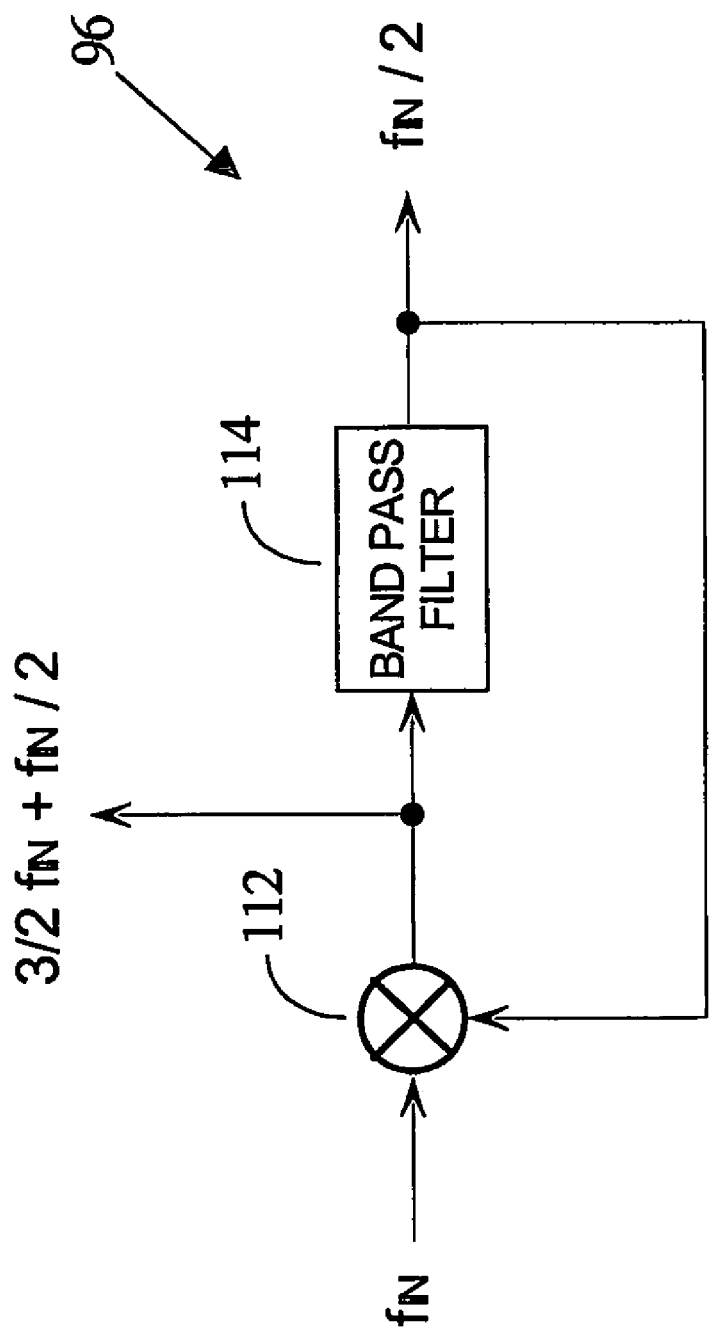
FIG. 7 presents a block diagram of a regenerative divider in an embodiment of the invention.

The basic circuit for a regenerative divide-by-2 96 is presented in the block diagram of FIG. 7. This circuit consists of two basic components, a mixer 112 and a band pass filter 114, arranged in series. An input signal $f_{IN}$, is mixed with the output signal $f_{OUT}$, and the output of the mixer 112 is filtered by the band pass filter 114. The simple analysis of this circuit is as follows.

As noted above, the two main outputs of concern from a mixer are the sum and differences of the two inputs. Thus, the two outputs of interest in this case are:

$$f_{OUT} = f_{IN} + f_{OUT} \quad (2)$$

$$f_{OUT} = f_{IN} - f_{OUT} \quad (3)$$

Equation (3) can be simplified as follows:

$$2 f_{OUT} = f_{IN}$$

$$f_{OUT} = f_{IN}/2 \quad (4)$$

In the case of the invention, a bandpass filter 114 is employed to allow only the $f_{IN}/2$ signal to pass. Thus, equation (3) can be ignored.

The two inputs to the mixer 112 are now $f_{IN}$ and $f_{OUT} = f_{IN}/2$. Substituting this into equation (2):

$$f_{OUT} = f_{IN} + f_{IN}/2$$

$$f_{OUT} = 3/2 f_{IN} \quad (5)$$

The output of mixer 112 is therefore:

$$f_{OUT} = 3/2 f_{IN} + f_{IN}/2 \quad (6)$$

In this embodiment of the invention, only the $f_{IN}/2$ signal is used. If a 3/2 $f_{IN}$ signal was required for some purpose, it could easily be picked up from the filter side of the mixer 112, and be filtered from the $f_{IN}/2$ signal.

As noted, having an off-chip local oscillator (LO) at the frequency of the incoming signal can allow self-mixing to occur because the tracks of the printed circuit board (PCB) and pins of integrated circuits act as antennas for the LO signal to radiate. Using a VCO 94 at a different frequency than the incoming signal x(t), and placing the regenerative divider 96 on chip, minimizes the possibility of self-mixing.

Figure 8A:
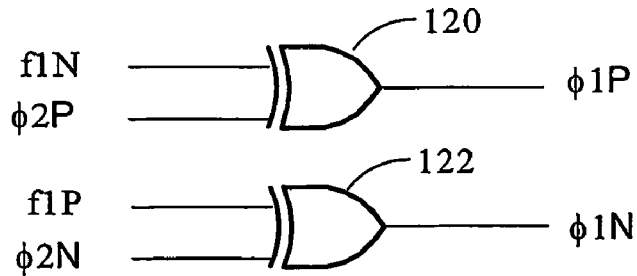
FIGS. 8A, 8B and 8C present logic diagrams of various circuits for generating mixing signals ϕ1P and ϕ1N in different embodiments of the invention.
Figure 8B:
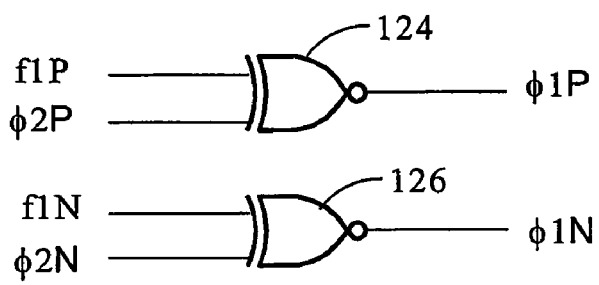

The output signals from the regenerative divider 96 are then filtered with the HPF 98, and passed to the logic gates 100. The logic gates 100 could be implemented in many ways, depending on the pattern of the mixing signals being generated. The mixing signals described with respect to FIG. 6 can be generated provided that the following equations or their logical equivalents are realized:

1. using two XOR gates 120, 122 per FIG. 8A, where:
   a. $\phi 1P = \phi 2P$ XOR f1N; and
   b. $\phi 1N = \phi 2N$ XOR f1P;
2. using two XNOR gates 124, 126 per FIG. 8B, where:
   a. $\phi 1P = \phi 2P$ XNOR f1P; and
   b. $\phi 1N = \phi 2N$ XNOR f1N; or
3. using AND 128, 130, 132, 134 and OR gates 136, 138 per FIG. 8C, where:
   a. $\phi 1P = (\phi 2P$ AND f1P) OR ($\phi 2N$ AND f1N); and
   b. $\phi 1N = (\phi 2P$ AND f1N) OR ($\phi 2N$ AND f1P).

Figure 8C:
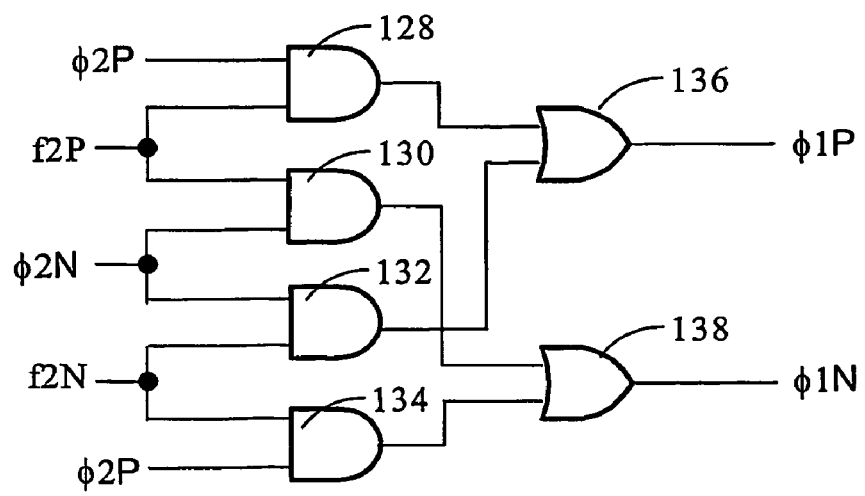

Because the pairings of P and N signals are complements of one another, many variations can be made to these logic gates 100. As well, of course, if different $\phi 1$ and $\phi 2$ signal pairs are used, the design of the logic gates 100 could be quite different. In the embodiment described with respect to FIG. 9, the logical design of FIG. 8C is employed. This arrangement is used because it is quite similar to the design of the passive mixer 84—the symmetry of these two circuits helps increase the value of WmU.

Exemplary Differential Implementation

Figure 9:
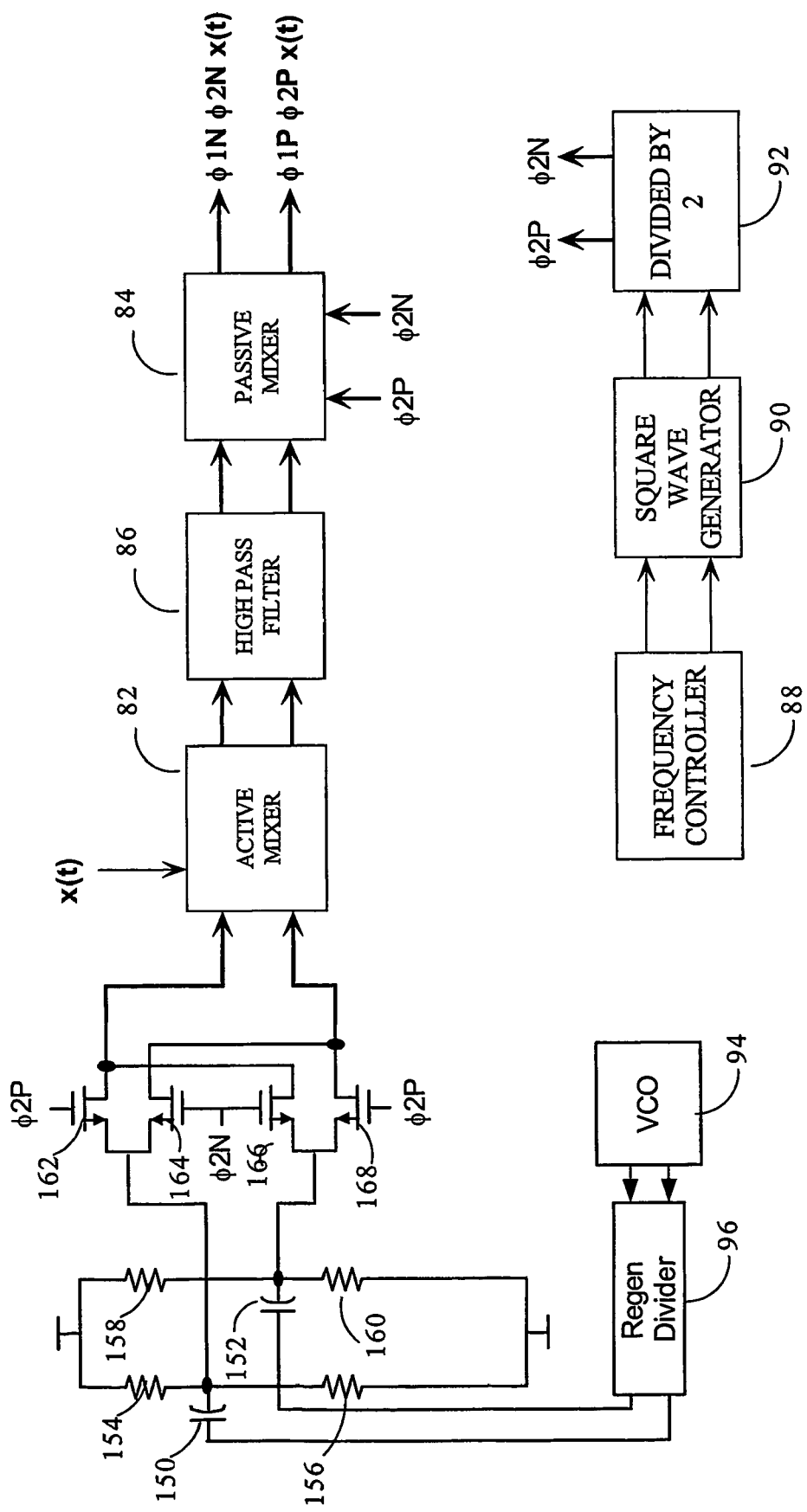
FIG. 9 presents a schematic diagram of a filter and logic circuit for generating multi-tonal mixing signals in an embodiment of the invention.
Figure 10:
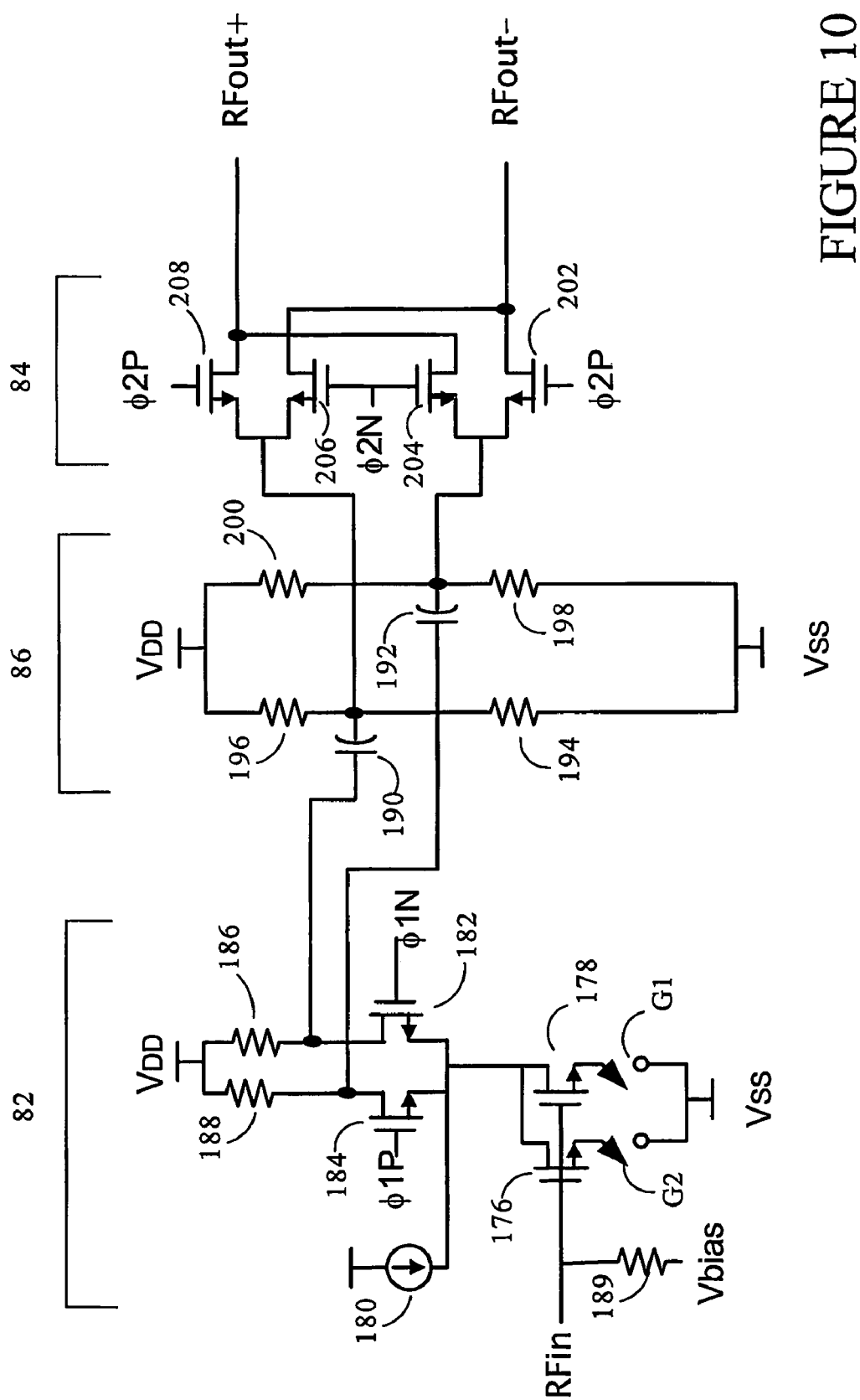
FIG. 10 presents a schematic diagram of the core mixers and high pass filter in an embodiment of the invention.
Figure 11:
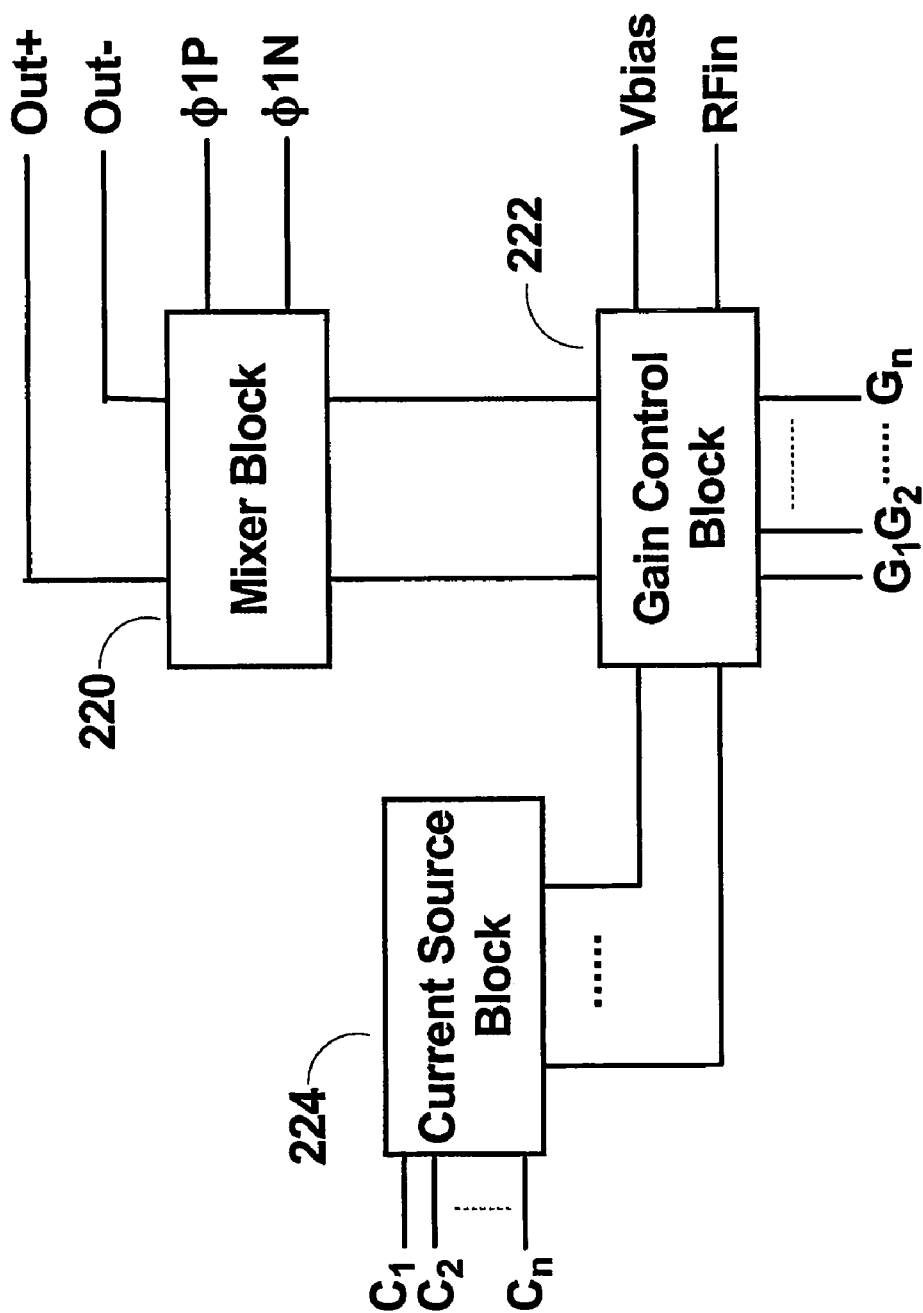
FIG. 11 presents a block diagram of an active mixer in an embodiment of the invention.

An exemplary implementation of the invention is presented in the schematic diagrams of FIGS. 9 through 11. FIG. 9 presents the details of the HPF 98 and logic gates 100. The details of the active mixer 82, high pass filter 86 and passive 84 are described with respect to FIGS. 10 and 11. The balance of the components are as described above.

In FIG. 9, the differential high pass filter 98 receives a differential pair of mono-tonal signals from the regenerative divider 96, and filters them with a pair of high pass filters, each consisting of a capacitor 150, 152 and two resistors 154, 156, 158 and 160. The use of the resistors 154, 156, 158 and 160 in the configuration of voltage dividers across positive and negative voltage sources ($V_{DD}$ being positive and $V_{SS}$ being negative), and sets the common mode voltage for the next stage.

The next stage shows the realization of the logic circuit of FIG. 8C, using four semiconductor switches 162, 164, 166 and 168. When the gates of these semiconductor switches 162, 164, 166 and 168 are energized by their respective $\phi 2P$ and $\phi 2N$ inputs, they become conductive. Thus, this circuit implements the logic calculations:

$$\phi 1P = (\phi 2P \text{ AND } f1P) \text{ OR } (\phi 2N \text{ AND } f1N) \text{ and} \quad (7)$$

$$\phi 1N = (\phi 2P \text{ AND } f1N) \text{ OR } (\phi 2N \text{ AND } f1P). \quad (8)$$

An exemplary implementation of the active mixer 82, high pass filter 86 and passive 84 will now be described with respect to FIGS. 10 and 11. To begin with:

1. the active mixer 82 is a single-balanced active mixer which receives a single-ended RF input, x(t). As well, it has electronically adjustable gain and a differential output;
2. the high pass filter 86 is differential, and also incorporates a voltage divider for setting the common mode output, and rejecting common mode noise and second order distortion terms; and
3. the passive mixer 84 is a differential passive mixer.

The input to this circuit is a simple, single-ended RF signal labelled x(t) (single-ended means there is a single potential with respect to ground), and the output is a differential RF or baseband signal labelled $\phi 1N$ $\phi 2N$ x(t) and $\phi 1P$ $\phi 2P$ x(t). The frequency of the x(t) signal is demodulated down to a differential output signal, $\phi 1N$ $\phi 2N$ x(t) and $\phi 1P$ $\phi 2P$ x(t), in accordance with the parameters of the mixing signals.

In the embodiment of FIG. 10, four mixing signals are used, in two stages. The first stage mixes the input signal with a pair of aperiodic signals $\phi 1P$ and $\phi 1N$, where $\phi 1P$ and $\phi 1N$ are inverses of one another, that is: $\phi 1P = -(\phi 1N)$. Similarly, the second mixing stage mixes the received signal with aperiodic signals $\phi 2P$ and $\phi 2N$, where again, $\phi 2P$ and $\phi 2N$ are inverses of one another: $\phi 2P = -(\phi 2N)$. As well, these pairs of mixing signals exhibit the synergy described above, that is, the pair of mixing signals φ1P and φ2P can emulate a local oscillator.

As well, the circuit in FIG. 10 is powered by a positive voltage source ($V_{DD}$) and a negative voltage source ($V_{SS}$).

Because the active mixer 82 is a single-balanced mixer, it will generate less noise than a double-balanced mixer. This is simply because there are fewer noise contributors in the single-balanced design. However, the single-balanced mixer is less immune to external noise, particularly common mode noise.

The structure of the active mixer 82 is also presented in the block diagram of FIG. 11 where the components are collected into three groups: a Mixer Block 220, a Gain Control Block 222, and a Current Source Block 224.

Briefly, the Gain Control Block 222 is a gain-providing stage that consists of a number of input transistors, shown in FIG. 10 as transistors 176 and 178. Each input transistor is fed with the same input signal x(t), and their outputs are fed to the Mixer Block 220 as amplified signals. The selection of the input transistor to be used at a particular time is accomplished using switches $G_1, G_2 \ldots G_n$.

The conditions of operation, and hence performance, of the Gain Control Block 222 are further alterable through the Current Source Block 224 which provides a variable amount of biasing current to the Gain Control Block 222. The amount of biasing current is controlled by the application of various conditions to current control inputs $C_1, C_2 \ldots C_n$.

While only two input transistors 176 and 178 are shown in FIG. 10, each having different biasing and other electrical performance characteristics, it will be apparent to one skilled in the art that this number might be varied to accommodate the design considerations of a particular application. The changes to the circuitry to adjust for this varied number would be clear to one skilled in the art.

Using multiple input transistors has the effect of increasing the number of possible combinations of conditions and performance available to be chosen without significantly increasing the size and complexity of the circuitry.

FIG. 11 also presents the relationship of the Gain Control Block 222 to the Current Source Block 224. The Current Source Block 224 provides a means to control the amount of current being fed to the Gain Control Block 222 so that this current is not drawn entirely from the Mixer Block 230.

The Current Source Block 224 comprises a number of controllable current sources. In FIG. 10, only one current source 180 is shown, but multiple sources and electronic switches could be employed. The control is limited to the ability to enable or disable a particular current source, which is accomplished using the current control inputs $C_1, C_2 \ldots C_n$.

If two current sources are used, it is possible to select both current sources so that their combined currents are passed to the Gain Control Block 222, thereby providing up to three different current levels. Similarly, having three current sources will allow up to seven different current levels to be selected.

The current source 180 is arranged to provide the current required by the RF amplifier transistors 176 and 178 thereby requiring the active mixer switches 182 and 184 to provide only a small proportion of the current required for the Gain Control Block 222. As will be appreciated by those skilled in the art, the reduced contribution of current to the Gain Control Block 222 via the active mixer switches 182 and 184, results in less noise being referred to the inputs of the RF amplifier transistors 176 and 178 and also less noise being generated by the resistive load of the active mixer circuit 170, resulting in improved overall noise performance. At the same time, the total current flowing through the RF amplifier transistors 176 and 178 can be maintained at a level sufficient to ensure their operation at the required gain and linearity.

The linearity of the active mixer 170 is also improved by this current injection between the input amplifier and the mixer switching transistors 186 and 188 because the current flowing through the input amplifier (Gain Control Block 222) can be substantially independent of that flowing through the mixer switches transistors 186 and 188. This independence means that the switches can be biased optimally without prejudicing the noise and gain performance of the input amplifier stage (Gain Control Block 222).

The balanced mixer block 220 is effected by two separate transistor and resistor pairings, which receive the amplified RF signals from the Gain Control Block 222. The amplified RF signal is passed to the sources of the switching transistors 182 and 184, and the drains of transistors 182 and 184 are connected to load resistors 186 and 188. By feeding the gates of the switching transistors 182 and 184 with complementary mixing signals φ1P and φ1N, that is, φ1P=−(φ1N), a differential output signal is received. The value of the load resistors 186 and 188 is selected to provide the best bias conditions for the mixer transistors.

Additional details regarding the design and implementation of the active mixer 82 are given in the co-pending patent application filed under Canadian Patent Application Serial No. 2,375,438, titled: "Improvements to a High Linearity Gilbert I Q Dual Mixer".

Other active mixer designs may also be used, as known in the art, or variations on the above used. For example, the RF amplifier transistors 176, 178 in the Gain Control Block 222 may be degenerated by an impedance to improve its linearity. Reactive degeneration generally has better noise performance than resistive degeneration, and inductive degeneration is more current efficient than both resistive and capacitive degeneration. However, with capacitive degeneration, negative resistance may cause oscillation.

In the preferred embodiment though, field effect transistors (FETs) are used as shown in FIG. 10. FETs generally have sufficient linearity that degeneration is not necessary.

Outputs from the two switching transistors 184, 182 in the active mixer 82, are then passed through a pair of high pass filters 86, each consisting of a capacitor 190, 192 and two resistors 194, 196, 198 and 200. Like the HPF 98 desribed with respect to FIG. 9, the use of the resistors 194, 196, 198 and 200 in the configuration of a voltage divider not only serves to drain the capacitors 190, 192 of the high pass filter, but also sets the common mode voltage for the next mixing stage (note that these resistors 194, 196, 198 and 200 could be active resistors).

Also, note that the cut-off frequency of the pair of high pass filters 86 can be very low (either low with respect to the carrier frequency or close to DC, depending on the application and expected signals). As a result it may be considered to function almost entirely in the manner of a voltage divider. Also, the pair of high pass filters 86 might be effected in other manners, for example, in the form of an 'active resistor' network.

The outputs of the pair of high pass filters 86 are then passed to the inputs of the respective halves of a differential, passive mixer 84, whose other inputs are the aperiodic signals φ2P and φ2N, which work in concert with the φ1P and φ1N mixing signals used in the active mixer 82. In FIG.

10, the passive mixer 84 comprises a known design having four transistors 202, 204, 206 and 208. Other architectures could also be used.

As noted above, this second mixing stage completes the emulation of the local oscillator mixing, frequency translating the input RFin signal to the desired output signal φ1N φ2N x(t) and φ1P φ2P x(t). If this circuit is being used to demodulate a signal down to baseband, as it would in the case of a radio receiver, it may then be desirable to pass the outputs of the passive mixer 84 through a low pass filter to remove any significant out-of-band signals.

One of the further benefits of this design is the use of simple resistive elements to fix the active mixer biasing voltages. This assists in the selection of optimal performance parameters for the second passive mixer.

The linearity of an active mixer is dependent on the biasing voltage of transistors. There are at least two sources of non-linearity in the active mixer 82: the non-linearity of the RF amplifier transistors and that of the switching transistors. The optimum biasing must be found through simulation or other techniques. The bias voltage applied to each of the drains of the active mixer switches is thereby selected and fixed to that necessary for optimum linearity during design.

Virtual Local Oscillator Signals

An exemplary set of VLO signals were described hereinabove. The purpose of this section is to present VLO signals in a more general way, as any number of VLO signals could be generated with which the invention could be implemented.

A periodic or time-varying mixing signals offer advantages over previously used mono-tonal oscillator signals. A given pair of these virtual local oscillator (VLO) signals φ1 and φ2 have the properties that:
1. their product emulates a local oscillator (LO) signal that has significant power at the frequency necessary to translate the input signal x(t) to the desired output frequency. For example, to translate the input signal x(t) to baseband, $\phi 1(t)*\phi 2(t)$ must have a frequency component at the carrier frequency of x(t); and
2. one of either φ1 and φ2, has minimal power around the frequency of the mixer pair output $\phi 1(t)*\phi 2(t)*x(t)$, while the other has minimal power around the centre frequency, $f_{RF}$, of the input signal x(t). "Minimal power" means that the power should be low enough that it does not seriously degrade the performance of the RF chain in the context of the particular application.

For example, if the mixer pair is demodulating the input signal x(t) to baseband, it is preferable that one of either φ1 and φ2 has minimal power around DC.

As a result, the desired demodulation is affected, but there is little or no LO signal to leak into the signal path and appear at the output.

As noted above, mixing two signals together generates an output with:
(a) a signal equal in frequency to the sum of the frequencies of the input signals;
(b) a signal equal in frequency to the difference between the frequencies of the input signals; and
(c) the original input frequencies.

Thus, direct conversion receivers known in the art must mix the input signal x(t) with a LO signal at the carrier frequency of the input signal x(t). If the LO signal of a direct conversion receiver leaks into the signal path, it will also be demodulated to baseband along with the input signal x(t), causing interference. The invention does not use an LO signal, so leakage does not generate a signal at the baseband output $\phi 1(t)*\phi 2(t)*x(t)$.

Any signal component at the frequency of the input signal x(t) or the output signal $\phi 1(t)*\phi 2(t)*x(t)$, in either of the mixing signals φ1 and φ2, is suppressed or eliminated by the other mixing signal. For example, if the mixing signal φ2 has some amount of power within the bandwidth of the up-converted RF (output) signal, and it leaks into the signal path, then if will be suppressed by the φ1 mixing signal which has minimal power within the bandwidth of the up-converted RF (output) signal. This complementary mixing suppresses interference from the mixing signals φ1 and φ2.

As noted above, current receiver and transmitter technologies have several problems. Direct-conversion transceivers, for example, suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using the complementary VLO signals. These signals are complementary in that one of the φ1 and φ2 signals has minimal power around the frequency of the output signal y(t) (which is around DC if conversion is to baseband), and the other has minimal power around the centre frequency, $f_{RF}$, of the input signal x(t).

These signals φ1 and φ2 can, in general, be:
1. random or pseudo-random, periodic functions of time;
2. analogue or digital waveforms;
3. constructed using conventional or non-conventional bipolar waves;
4. averaging to zero;
5. amplitude modulated; and
6. generated in a number of manners including:
   a. being stored in memory and clocked out;
   b. being generated using digital blocks;
   c. being generated using noise shaping elements (e.g. delta-sigma elements); or
   d. being constructed using PN sequences with additional bits inserted so they comply to the above conditions.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

Virtual local oscillator signals may also be generated in different forms, such as using three or more complementary signals rather than the two mixing signals shown above. These and other variations are described in the following co-pending patent applications:
1. PCT International Application Serial No. PCT/CA00/00995 Filed Sep. 1, 2000, titled: "Improved Method And Apparatus For Up-Conversion Of Radio Frequency (RF) Signals";
2. PCT International Application Serial No. PCT/CA00/00994 Filed Sep. 1, 2000, titled: "Improved Method And Apparatus For Down-Conversion Of Radio Frequency (RF) Signals"; and
3. PCT International Application Serial No. PCT/CA00/00996 Filed Sep. 1, 2000, titled: "Improved Method And Apparatus For Up-And-Down-Conversion Of Radio Frequency (RF) Signals".

Differential Application

The invention may also be implemented with an input signal available as a differential signal (i.e. having positive and negative potentials with respect to ground). This circuit is very much the same as that of FIG. 10. The active mixer of this embodiment offers the same functionality as the single-balanced active mixer 82 of FIG. 10 (i.e. electronically adjustable gain and linearity controls), except that it is a double-balanced mixer which can receive a differential RF input receives a differential voltage, x(t)+, x(t)− as the radio frequency (RF) input signal.

In fact, the double-balanced mixer simply comprises two single-balanced mixers with the same structure as the single-balanced mixer 82 described with respect to FIG. 10 above. Each of components in the single-balanced mixer 82 is mirrored in the second half of the double-balanced mixer.

Such a circuit is described in detail in the co-pending patent application filed in the United States on Mar. 8, 2002, under application Ser. No. 10/096,118, and titled "Integrated Circuit Adjustable RF Mixer".

The use of a differential input architecture results in a stronger output signal that is more immune to common mode noise than the single ended input architecture of FIG. 10. If, for example, environment noise imposes a noise signal onto the input x(t) of FIG. 10, then this noise signal will propagate through the circuit. However, if this environment noise is imposed equally on the x(t)+ and x(t)− inputs in the differential circuit, then the net effect will be null.

Multi-Band/Multi-Standard Application

A mixer topology that is suitable as part of a multi-band/multi-standard receiver, is described in detail in the co-pending patent application filed under the Patent Cooperation Treaty under application number PCT/CA02/01316, filed on Aug. 28, 2002, and titled Improved Apparatus And Method For Down Conversion.

The topology shown and described in this co-pending application is almost the same as that of FIG. 10. The difference is simply that it offers the added functionality of receiving more than one RF input, which can be electronically selected. This is effected simply by means of electronic switches ($S_1$, $S_2$ ... $S_n$) connected to various RF inputs (RFin1, RFin2 ... RFinn), the switches being used to control which RF signal is to applied to the mixing transistors 176, 178.

In-Phase and Quadrature Signals

In many modulation schemes, it is necessary to modulate or demodulate both in-phase (I) and quadrature (Q) components of the input signal.

In such a case, four modulation functions would have to be generated: $\phi 1I$ which is 90 degrees out of phase with $\phi 1Q$; and $\phi 2I$ which is 90 degrees out of phase with $\phi 2Q$. The pairing of signals $\phi 1I$ and $\phi 2I$ must meet the function selection criteria listed above, as must the signal pairing of $\phi 1Q$ and $\phi 2Q$.

Design of components to generate such signals would be clear to one skilled in the art from the description herein. As well, additional details on the generation of such signals are available in the co-pending patent applications filed under PCT International Application Serial Nos. PCT/CA00/00994, PCT/CA00/00995 and PCT/CA00/00996.

Advantages of the Invention

The invention provides many advantages over other down convertors known in the art. To begin with, it offers:
1. minimal 1/f noise;
2. minimal imaging problems;
3. minimal leakage of a local oscillator (LO) signal into the RF output band;
4. removes the necessity of having a second LO as required by super-heterodyne circuits, and various (often external) filters; and
5. has a higher level of integration as the components it does require are easily placed on an integrated circuit. For example, no large capacitors or sophisticated filters are required.

A high level of integration results in decreased IC (integrated circuit) pin counts, decreased signal power loss, decreased IC power requirements, improved SNR (signal to noise ratio), improved NF (noise factor), and decreased manufacturing costs and complexity.

The invention also addresses the problem of spurious problems by:
1. reducing WmU;
2. providing a circuit in which mixing signals can be adjusted so that spurs are shifted away from the desired signals; and
3. providing a circuit which allows mixing signals to frequency hop so that the probability of spurs interfering with desired signals can be reduced.

The design of the invention also makes the production of inexpensive multi-standard/multi-frequency communications transmitters and receivers a reality.

The benefits of the invention are most apparent when it is implemented within a single-chip design, eliminating the extra cost of interconnecting semiconductor integrated circuit devices, reducing the physical space they require and reducing the overall power consumption. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Options and Alternatives

A number of variations can be made to the topology of FIGS. 4-11 including the following:
1. the circuit can be implement using bipolar technology, CMOS technology, BiCMOS technology, or another semiconductor technology;
2. the regenerative circuit 96 may be replaced by a divide-by-N element;
3. any other mixer described in the art may replace the first mixer 82; or
4. a poly-phase filter may be replaced between the regenerative circuit 96 and the logic gates 100 or absorbed into the regenerative circuit 96.

CONCLUSIONS

It will be apparent to those skilled in the art that the invention can be extended to cope with more than two or three standards, and to allow for more biasing conditions than those in the above description.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The various preferred implementations in this section are each described in terms of field effect transistors. The implementations are equally advantageous when other technologies are used, including, but not limited to CMOS or Bipolar Junction Transistors. Similarly, suitable fabrication technologies other than Silicon (Si) may be used, including, but not limited to Silicon/Germanium (SiGe), Germanium (Ge), Gallium Arsenide (GaAs), and Silicon on Sapphire (SOS). It is the inventors' intention to protect all such implementations.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A demodulator circuit for emulating the down conversion of an input signal x(t) with a local oscillator (LO) signal, said demodulator circuit comprising:
    a first mixer for receiving said input signal x(t), and mixing said input signal x(t) with a multi-tonal mixing signal φ1, to generate an output signal φ1 x(t);
    a second mixer for receiving said signal φ1 x(t) as an input, and mixing said signal φ1 x(t) with a mono-tonal mixing signal φ2, to generate an output signal φ1 φ2 (t);
    a first signal generator for generating an oscillator signal f1;
    a second signal generator for generating said mono-tonal mixing signal φ2, where the frequency of f1 is a multiple of the frequency of φ2; and
    a logic circuit for receiving said oscillator signal f1 and said mono-tonal mixing signal φ2, and generating said multi-tonal mixing signal φ1, where φ1*φ2 has significant power at the frequency of said local oscillator signal being emulated, neither of said φ1 nor said φ2 having significant power at the carrier frequency of said input signal x(t) or said LO signal being emulated.

2. The circuit of claim 1 wherein said logic circuit comprises an exclusive OR gate (XOR), and φ1=f1 XOR φ2.

3. The circuit of claim 1 wherein unwanted power at baseband is minimized by adjusting the frequency of said φ2 signal such that unwanted RF tones do not fall on top of said input signal x(t) at baseband.

4. The circuit of claim 1 wherein unwanted power at baseband is minimized by frequency hopping said φ2 signal so that the probability of unwanted RF tones falling on top of φ1*φ2 x(t) insignificantly reduced.

5. The circuit of claim 1 wherein said first signal generator comprises:
    an oscillator for generating an oscillator signal; and
    a regenerative divider for receiving said oscillator signal and converting said oscillator signal to said f1 signal.

6. The circuit of claim 5 wherein said oscillator is a voltage-controlled oscillator.

7. The circuit of claim 5 wherein said oscillator that is tuned to a multiple of the carrier frequency of said input signal x(t) and said regenerative divider comprises a divide-by-n element.

8. The circuit of claim 6 wherein said oscillator further comprises a high pass filter.

9. The circuit of claim 1 wherein said first signal generator comprises an oscillator that is tuned to a divisor of the carrier frequency of said input signal x(t) and a multiply-by-n element.

10. The circuit of claim 1 wherein said second signal generator comprises:
    a frequency controller; and
    a square wave generator.

11. The circuit of claim 10 wherein said second signal generator further comprises:
    a divide-by-2 element to ensure that a fifty percent duty cycle is provided.

12. The circuit of claim 10 wherein said frequency controller is operable to hop said φ2 signal from one frequency to another, reducing the probability of the output of said circuit having power at an unwanted frequency.

13. The circuit of claim 10 wherein said frequency controller is responsive to noise in said output signal φ1 φ2 x(t) by adjusting the frequency of φ2.

14. The circuit of claim 10 wherein said first mixer comprises an active mixer.

15. The circuit of claim 14 wherein said first mixer comprises an active mixer having adjustable performance.

16. The circuit of claim 15, wherein said active mixer has adjustable gain.

17. The circuit of claim 15, wherein said active mixer has adjustable linearity.

18. The circuit of claim 15, wherein said active mixer comprises a current-source whose parameters can be adjusted to control gain and linearity of said active mixer.

19. The circuit of claim 15, wherein said active mixer comprises multiple driver components, each for receiving a different input signal in a multi-standard radio.

20. The circuit of claim 14 further comprising a high pass filter electrically connected between said first mixer and said second mixer.

21. The circuit of claim 20 wherein said second mixer comprises a passive mixer.

22. The circuit of claim 21, wherein each of said active mixer, said high pass filter and said passive mixer is a differential device.

23. The circuit of claim 22, wherein said high pass filter comprises a resistor dividing network for setting the common mode voltage output.

24. The circuit of claim 5 wherein said oscillator, said regenerative divider and said logic circuit are differential.

25. The circuit of claim 24 wherein said logic circuit comprises two exclusive OR (XOR) gates.

26. The circuit of claim 24 wherein said logic circuit comprises two exclusive-NOR (XNOR) gates.

27. The circuit of claim 24 wherein said logic circuit comprises four AND gates and two OR gates arranged to generate:

$\phi 1P = (\phi 2P \text{ AND } f1P) \text{ OR } (\phi 2N \text{ AND } f1N);$ and $\phi 1N = (\phi 2P \text{ AND } f1N) \text{ OR } (\phi 2N \text{ AND } f1P).$ 28. The circuit of claim 24 wherein said logic circuit comprises four semiconductor switches arranged to generate:

$\phi 1P = (\phi 2P \text{ AND } f1P) \text{ OR } (\phi 2N \text{ AND } f1N);$ and $\phi 1N = (\phi 2P \text{ AND } f1N) \text{ OR } (\phi 2N \text{ AND } f1P).$ 29. A method of emulating the demodulation of an input signal x(t) to the product of said input signal with a local oscillator (LO) signal, said method comprising the steps of:

generating an oscillator signal f1;

generating a mixing signal $\phi 2$, where f1 is four times the frequency of $\phi 2$;

generating an aperiodic mixing signal $\phi 1$, using a logic circuit which receives said oscillator signal f1 and said second mixing signal $\phi 2$, as inputs, where $\phi 1 * \phi 2$ has significant power at the frequency of a local oscillator signal being emulated, and neither of said $\phi 1$ nor said $\phi 2$ having significant power at the frequency of said input signal x(t), said LO signal being emulated, or said output signal $\phi 1$ $\phi 2$ x(t);

mixing said input signal x(t) with said aperiodic mixing signal $\phi 1$, to generate an output signal $\phi 1$ x(t); and mixing said signal $\phi 1$ x(t) with a second mixing signal $\phi 2$, to generate an output signal $\phi 1$, $\phi 2$ x(t).

* * * * *